US009755062B2

(12) United States Patent
Then et al.

(10) Patent No.: US 9,755,062 B2
(45) Date of Patent: Sep. 5, 2017

(54) III-N MATERIAL STRUCTURE FOR GATE-RECESSED TRANSISTORS

(71) Applicant: Intel Corporation, Santa Clara, CA (US)

(72) Inventors: Han Wui Then, Portland, OR (US); Marko Radosavljevic, Beaverton, OR (US); Uday Shah, Portland, OR (US); Niloy Mukherjee, Beaverton, OR (US); Ravi Pillarisetty, Portland, OR (US); Benjamin Chu-Kung, Hillsboro, OR (US); Jack T. Kavalieros, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/389,255

(22) Filed: Dec. 22, 2016

(65) Prior Publication Data

US 2017/0104094 A1    Apr. 13, 2017

Related U.S. Application Data

(63) Continuation of application No. 14/935,346, filed on Nov. 6, 2015, now Pat. No. 9,530,878, which is a (Continued)

(51) Int. Cl.
*H01L 21/268*   (2006.01)
*H01L 29/778*   (2006.01)
(Continued)

(52) U.S. Cl.
CPC .... *H01L 29/7787* (2013.01); *H01L 21/02241* (2013.01); *H01L 21/02252* (2013.01);
(Continued)

(58) Field of Classification Search
CPC ......... H01L 21/02241; H01L 21/02252; H01L 21/02255; H01L 21/02258; H01L 21/268;
(Continued)

(56) References Cited

U.S. PATENT DOCUMENTS 7,253,061 B2 *   8/2007   Peng ................. H01L 21/02241
                                                    257/E21.207
7,655,994 B2     2/2010   Cartier et al.
(Continued)

FOREIGN PATENT DOCUMENTS

CN    102017160 A    4/2011
CN    102265474 A    11/2011
(Continued)

OTHER PUBLICATIONS

Office Action (5 pages) by the German Patent and Trademark Office dated Aug. 31, 2016 for German Patent Application No. 112011105988.4 and English Translation thereof (5 pages).
(Continued)

*Primary Examiner* — Whitney T Moore
*Assistant Examiner* — Joseph Galvin, III
(74) *Attorney, Agent, or Firm* — Schwabe, Williamson & Wyatt P.C.

(57)   ABSTRACT

III-N transistors with recessed gates. An epitaxial stack includes a doped III-N source/drain layer and a III-N etch stop layer disposed between a the source/drain layer and a III-N channel layer. An etch process, e.g., utilizing photochemical oxidation, selectively etches the source/drain layer over the etch stop layer. A gate electrode is disposed over the etch stop layer to form a recessed-gate III-N HEMT. At least a portion of the etch stop layer may be oxidized with a gate electrode over the oxidized etch stop layer for a recessed gate III-N MOS-HEMT including a III-N oxide. A high-k dielectric may be formed over the oxidized etch stop layer
(Continued)

with a gate electrode over the high-k dielectric to form a recessed gate III-N MOS-HEMT having a composite gate dielectric stack.

20 Claims, 8 Drawing Sheets

Related U.S. Application Data continuation of application No. 14/630,541, filed on Feb. 24, 2015, now Pat. No. 9,209,290, which is a continuation of application No. 13/976,840, filed as application No. PCT/US2011/067220 on Dec. 23, 2011, now Pat. No. 8,987,091.

(51) Int. Cl.

| H01L 29/20 | (2006.01) |
|---|---|
| H01L 29/205 | (2006.01) |
| H01L 29/40 | (2006.01) |
| H01L 21/02 | (2006.01) |
| H01L 21/306 | (2006.01) |
| H01L 21/311 | (2006.01) |
| H01L 29/423 | (2006.01) |
| H01L 29/51 | (2006.01) |
| H01L 29/66 | (2006.01) |
| H01L 29/36 | (2006.01) |

(52) U.S. Cl.
CPC .. *H01L 21/02255* (2013.01); *H01L 21/02258* (2013.01); *H01L 21/268* (2013.01); *H01L 21/30612* (2013.01); *H01L 21/31111* (2013.01); *H01L 29/2003* (2013.01); *H01L 29/205* (2013.01); *H01L 29/365* (2013.01); *H01L 29/401* (2013.01); *H01L 29/4236* (2013.01); *H01L 29/518* (2013.01); *H01L 29/66462* (2013.01)

(58) Field of Classification Search
CPC ........... H01L 21/30612; H01L 21/3111; H01L 29/2003; H01L 29/205; H01L 29/365; H01L 29/401; H01L 29/4236; H01L 29/518; H01L 29/66462; H01L 29/7787
See application file for complete search history.

(56) References Cited

U.S. PATENT DOCUMENTS

| 8,253,220 | B2 | 8/2012 | Kajitani et al. |
| 8,519,438 | B2 | 8/2013 | Mishra et al. |
| 2007/0278507 | A1 | 12/2007 | Nakazawa et al. |
| 2008/0105901 | A1 | 5/2008 | Tabatabaie et al. |
| 2008/0108449 | A1 | 5/2008 | Middleton |
| 2009/0072240 | A1 | 3/2009 | Suh et al. |
| 2009/0267078 | A1* | 10/2009 | Mishra ............... H01L 29/2003 257/76 |
| 2010/0155701 | A1 | 6/2010 | Radosavljevic et al. |
| 2011/0147708 | A1 | 6/2011 | Radosavljevic et al. |
| 2011/0147713 | A1* | 6/2011 | Pillarisetty ........... H01L 29/401 257/24 |

FOREIGN PATENT DOCUMENTS

| CN | 102290439 A | 12/2011 |
| TW | 200832697 | 10/1996 |
| TW | 200924068 | 9/1997 |
| TW | 201010076 A1 | 3/2010 |

OTHER PUBLICATIONS

Office Action from the Taiwan Intellectual Property Office dated Feb. 9, 2015, Taiwan Patent Application No. 101146682 and Search Report (English Translation).

First Office Action from the Chinese Intellectual Property Office dated Mar. 2, 2016, Chinese Patent Application No. 201180075770.7.

Official Communication including Search Report from the Taiwan Intellectual Property Office dated May 6, 2016, Taiwan Patent Application No. 104126559.

International Search Report and Written Opinion mailed Aug. 1, 2012 for PCT/US2011/067220 filed Dec. 23, 2011, 9 pages.

Notice of Allowance (6 pages) from the Chinese State Intellectual Property Office (SIPO) dated Aug. 24, 2016 for Chinese Patent Application No. 201180075770.7 and English Translation (1page) thereof.

Notice of Allowance (2 pages) from the Taiwan Intellectual Property Office dated Nov. 28, 2016 for Taiwan Patent Application No. 104126559 and English Translation (1page) thereof.

\* cited by examiner

|  | n+ GaN | i-GaN | p-GaN | InN |
|---|---|---|---|---|
| Egap | 3.38 | 3.38 | 3.38 | 0.9 |
| Electron affinity | 4.1 | 4.1 | 4.1 | 5.8 |
| Ec-Ef | 0.2 | 1.69 | 2.535 | 0.45 |
| WF | 4.3 | 5.79 | 6.635 | 6.25 |
| $\Delta$WF vs H3PO4 | 0.157 | -1.333 | -2.178 | -1.793 |

III-N MATERIAL STRUCTURE FOR GATE-RECESSED TRANSISTORS

This is a Continuation of application Ser. No. 14/935,346 filed Nov. 6, 2015 which is Continuation of application Ser. No. 14/630,541 filed Feb. 24, 2015 now U.S. Pat. No. 9,209,290 issued Dec. 8, 2015 which is a Continuation of application Ser. No. 13/976,840 filed Jun. 27, 2013, now U.S. Pat. No. 8,987,091 issued Mar. 25, 2015 which is a U.S. National Phase Application under 35 U.S.C. §371 of International Application No. PCT/US2011/067220 filed Dec. 23, 2011.

TECHNICAL FIELD

Embodiments of the present invention generally relate to microelectronic devices and their manufacture, and more particularly to GaN gate-recessed transistors.

BACKGROUND

Many III-V transistor technologies are under investigation as candidates to eventually replace silicon transistor technology. For many III-V material systems, metal-oxide-semiconductor (MOS) high electron mobility transistor (HEMT) architectures are attractive. For such a device, gate-recessing and source/drain regrowth are two manufacturing alternatives typically practiced. For a gate recess technique, a starting material includes a complete epitaxial semiconductor stack that includes a heavily doped (e.g., N+) source/drain layer(s). A portion of the epitaxial stack including the source/drain layers is then etched to form a recess into which a gate electrode or gate stack (including a gate insulator) is disposed in close proximity to a channel layer of the epitaxial stack. In contrast, for a source/drain regrowth technique, a gate electrode or gate stack or dummy gate (which will eventually be replaced via a replacement gate electrode) is first disposed on a starting material that includes an epitaxial stack lacking the heavily doped source/drain layer(s). After gate formation, heavily doped source/drain regions are then epitaxially grown around the gate electrode.

One promising III-V transistor technology is based on III-nitrides (III-N), commonly referred to as GaN-based devices. While GaN MOS-HEMTs, may in theory be formed by either the gate-recessing or source/drain regrowth technique, practically speaking, gate-recessing is extremely difficult in GaN-based material stacks because simple wet etching solutions are not viable due to strong chemical bonds of GaN and no known dry etch stop chemistry is considered reliable. Gate-recessed MOS-HEMTs have the advantage of ultra-scaled gate-to-Source and gate-to-Drain distance, enabling the lowest possible transistor on resistance, access resistance, hence high transconductance and high fT/fMax. For these reasons, gate-recessed GaN devices today are based on timed dry etch. Such an approach requires precise control of process parameters, and the epitaxial layer thickness has to be precisely known ahead of time. This has negative implications for manufacturability and reliability as slight over etch results in damage to the GaN channel (e.g., loss of sheet charge, carrier mobility, increase in interface trap states, etc.) and under etch also adversely affects device parametrics (e.g., poor transconductance, high on-state resistance ($R_{ON}$), etc).

Because of the practical difficulty in the gate-recessed approach, the vast majority of state-of-the-art GaN HEMT and MOS-HEMT research focuses on regrowth of source and drain post formation of the gate stack. However, regrowth of an N+ GaN source and drain region also poses many technical challenges. For example, the Metal Organic Vapor Phase Epitaxy (MOVPE) growth temperature of N+ GaN is over 1000° C. Such a high temperature precludes the formation of high-k gate dielectric prior to source/drain regrowth because various gate dielectrics formed by atomic layer deposition (ALD), such as $HfO_2$, crystallize and otherwise degrade. Similarly, various metal gate electrode materials desirable for a particular work function also diffuse and degrade at such high temperatures. While the Molecular Beam Epitaxy (MBE) growth temperature of N+ GaN is less than 1000° C., because MBE is a line-of-sight deposition technique, "shadow" effects result in suboptimal (e.g., high resistance) and inconsistent device performance. These challenges have therefore generally required the use of a more complex replacement gate process to affect a source/drain regrowth technique in GaN-based devices.

Recessed gate GaN MOS-HEMTs employing highly N+ doped III-N layers as a contact layer to form low resistance ohmic contacts to source/drain metal are an attractive device architecture amenable to fabricating self-aligned gate structures and ultra-scaled spacer dielectrics to enable ultra low access resistance from source and drain to the channel. The ability to achieve low access resistance coupled with the ability to scale the gate length to deep submicron regime is important to obtaining low $R_{ON}$. Moreover, as a gate last process, the recessed gate technique offers many advantages including making possible a whole host of temperature sensitive high-k and metal gate solutions. These benefits along with the recessed-gate technique being able to scale the gate dielectric thickness aggressively make a recessed gate GaN-based MOS-HEMT architecture highly advantageous. Epitaxial stack materials for manufacturable gate-recessing techniques are therefore advantageous.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Described herein are III-N transistors with a recessed gate architecture and fabrication methods. A starting material has an epitaxial stack including a doped III-N semiconductor source/drain layer and a III-N semiconductor etch stop layer disposed between a the source/drain layer and a III-N semiconductor channel layer. A wet photochemical etch process, such as one utilizing photochemical oxidation, has selectivity to the source/drain layer over the etch stop layer, permitting a recess to be formed through the epitaxial stack and landing on the etch stop layer. In embodiments, the etch stop layer is non-sacrificial and a gate electrode is formed over the etch stop layer to form a gate-recessed III-N HEMT. In a further embodiment, at least a portion of the etch stop layer is oxidized and a gate electrode is formed over the oxidized etch stop layer to form a gate-recessed III-N MOSFET having a III-N oxide. In a further embodiment, a high-k dielectric is formed over the III-N oxide and a gate electrode is formed over the high-k dielectric for a gate-recessed III-N MOSFET having a composite gate dielectric stack.

Figure 1A:
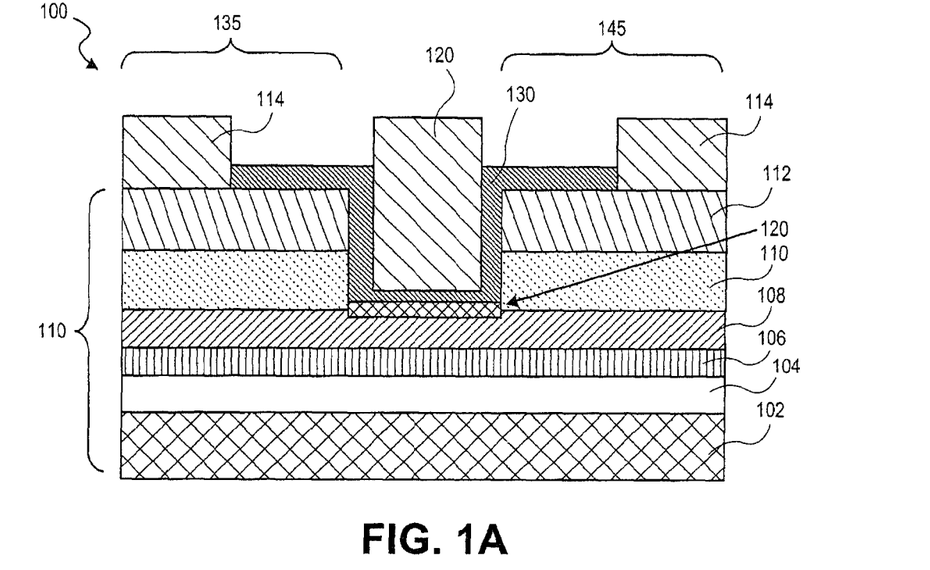
FIG. 1A illustrates a side view of a cross-section through a III-N MOS transistor with a composite gate dielectric, in accordance with an embodiment.

FIG. 1A illustrates a side view of a cross-section through a gate-recessed III-N MOS transistor 100 with a composite gate dielectric, in accordance with an embodiment. Generally, the transistor 100 is a majority carrier (electron), gate voltage controlled device (i.e., a FET) commonly referred to as a high electron mobility transistor (HEMT) and while depicted as planar for clarity, it is appreciated that known techniques may also be applied to achieve a non-planar transistor. The transistor 100 is disposed on a buffer layer 102 disposed on a support or donor substrate not illustrated. In one such embodiment, the buffer layer 102 is a bottom (first) layer of III-N semiconductor device stack 110 grown on a support substrate or is a bottom layer of a III-N semiconductor device stack 110 transferred onto a donor substrate. In a particular embodiment, the buffer layer 102 is GaN disposed on a (001) silicon support substrate, which is the preferred orientation for formation of silicon transistors and therefore is preferred for embodiments where the III-N transistor 100 is to be monolithically integrated with planar or non-planar silicon CMOS transistor technology. In alternate embodiments, the support substrate may also be of materials other than silicon, for example the support substrate may be GaN (in which case a buffer layer 102 is not required), carbon (SiC), and sapphire.

Functionally, the semiconductor device stack 110 is divided into a channel layer 104, a charge inducing layer and/or a top barrier layer 106, an etch stop layer 108, a source/drain transitional layer 110, and a source/drain layer 112. In the exemplary embodiment, the channel layer 104 is substantially single crystalline and although is referred to herein as "monocrystalline," one of ordinary skill will appreciate that a low level of crystal defects may nevertheless be present as artifacts of an imperfect epitaxial growth processes. Within the channel layer 104, there is a crystalline arrangement of a first semiconductor material including one or more group III elements and nitrogen (i.e., a III-N semiconductor). Generally, III-nitride semiconductor in the channel layer 104 should have relatively high carrier mobility and therefore in embodiments, the channel layer 104 is to be a substantially undoped III-nitride material (i.e., impurity concentration minimized) for minimal impurity scattering. As illustrated, the transistor 100 has no junctions formed by impurity dopant gradients to avoid disadvantages associated with dopant diffusion, scattering, and breakdown voltage degradation.

In a first exemplary embodiment, the channel layer 104 is GaN. In a second exemplary embodiment, the channel layer 104 is indium nitride (InN). In a third exemplary embodiment, the channel layer 104 is a ternary alloy of GaN, such as aluminum gallium nitride ($Al_xGa_{1-x}N$). In a fourth exemplary embodiment, the channel layer 104 is a ternary alloy of InN, such as aluminum indium nitride ($Al_xIn_{1-x}N$). In further embodiments, the channel layer 104 is a quaternary alloy including at least one group III element and nitrogen, such as $In_xAl_yGa_{1-x-y}N$. Depending on the embodiment, the channel layer 104 is between 5 nm and 20 nm in thickness.

As illustrated in FIG. 1A, on at least the top side of the channel layer 104 is a top barrier layer 106. The top barrier layer 106 is to controllably supply carriers by inducing a sheet of charge, commonly referred to as a 2-D electron gas (2DEG) within the channel layer 104. While the top barrier layer 106 may serve as the only source of sheet charge, a separate charge inducing layer (not depicted) may also be disposed between the channel layer 104 and top barrier 108 for potentially reduced alloy scattering and higher mobility in the channel layer 104. A bottom barrier layer (not depicted) may also be disposed below the channel layer 104 to help provide channel charge confinement for control of short channel effects (SCE) as longitudinal channel length ($L_G$) is scaled. However, a bottom barrier layer is not included in the exemplary embodiment as its presence can adversely affect the quality and composition of the channel layer 104 and is of little consequence to embodiments of the present invention.

Generally, any III-N materials may be utilized for the top barrier layer 106, as dependent on the III-N material selected for the channel layer 104 to provide the top barrier layer 106 with a larger bandgap than the channel layer 104. Preferably, the top barrier layer 106 is substantially monocrystalline (i.e., having a thickness below the critical thickness for the given composition), lattice matched to the III-N material utilized in the channel layer 104. In the exemplary embodiment, the top barrier layer 106 is of a second III-N material having the same crystallinity as that of the channel layer 104 to form a heterointerface. In the exemplary embodiment where the channel layer 104 is GaN, the top barrier layer 106 is intrinsic $Al_{1-x-y}In_xGa_yN$ (x, y<1). In other embodiments, the top barrier layer 106 is intrinsic $Al_xIn_{1-x}N$ although it is practically difficult to transition a growth from GaN (for the channel layer 104) to a film devoid of Ga. In one exemplary where top barrier layer 106 is $Al_{1-x-y}In_xGa_yN$, x+y is less than 0.25. In other embodiments, the top barrier layer 106 is $Al_xGa_{1-x}N$, or $In_zGa_{1-z}N$. The top barrier layer 106 may further comprise any multilayer stack of III-Nitrides, for example, an $Al_xIn_{1-x}N$/AlN stack with the AlN layer of the stack adjacent to channel layer 104 (as a charge inducing layer with improved mobility relative to having $Al_xIn_{1-x}N$ adjacent to the channel layer 104). Depending on the embodiment, the top barrier layer 106 has a thickness ranging between 1 nm and 5 nm.

The source/drain transitional layer 110 is functionally a transition to the source/drain layer 112. Compositionally, the source/drain transitional layer 110 is a III-N semiconductor material and may be compositionally graded. As a transitional layer, there is to be minimal (intrinsic) dopant level although in some embodiments there may be a light n-type doping. As described further elsewhere herein, there is to be a chemical etch selectivity achieved between the source/drain transitional layer 110 and the etch stop layer 108, therefore the composition of the source/drain transitional layer 110 is constrained to be one which will be etch in the selective recess etch process. In the exemplary embodiment, the source/drain transitional layer 110 is GaN, and deliberately doped.

The source/drain layer 112 is to provide for low contact resistance to an ohmic contact metal 114 for each of a source 135 and drain 145. As such, the source/drain layer 112 is heavily impurity doped with for example, any n-type impurity known in the art for III-N semiconductors, such as, but not limited to silicon (Si). In the exemplary embodiment, the source/drain layer 112 is GaN (n-type) although other low band gap III-N material, such as $In_xGa_{1-x}N$ and InN, may also be utilized for formation of low resistance contacts. The selection of III-N materials for the source/drain layer 112 is particularly unconstrained where the source/drain layer 112 is to be entirely dry plasma etched with the dry etch terminated at an etched recess depth that falls within the source/drain transition layer 110 so that there is no need for the source/drain layer 112 to have a composition that is etchable by the recess etch process utilized to clear the source/drain transition layer 112.

Disposed over the top barrier layer 106 and below the source/drain transition layer 112 is the etch stop layer 108. It is the inclusion of the etch stop layer within stack 110 which enables good control of the III-N gate recess fabrication technique, as further described elsewhere herein. In further embodiments, the etch stop layer is further utilized to form a high quality interfacial oxide over the channel layer 104 to achieve a low $R_{ON}$ between the source and drain, as well as a low knee-voltage for high RF power output.

Generally, the etch stop layer 108 is to have a composition or impurity which is distinct from at least the source/drain transition layer 110, and may further be distinct from the source/drain layer 112, as well as the top barrier layer 106. The etch stop layer may advantageously be of a different composition than the top barrier layer 106 so that the thickness of the etch stop layer does not adversely affect or vary the amount of sheet charge in the channel layer 104 and further relieve the top barrier layer from an additional functional constraint on its composition. In embodiments therefore, the etch stop layer 108 comprises an atomic species that is absent from the barrier layer 106. More specifically, the composition, including impurity dopants, is to be such that at least one of an electron affinity or a band gap of the etch stop layer 108 is sufficiently large that a photochemical etch process capable of etching the source/drain transition layer 110 is either completely incapable of etching the etch stop layer 108 or etches at rate that is at least an order of magnitude slower than the source/drain transition layer 110.

Figure 4A:
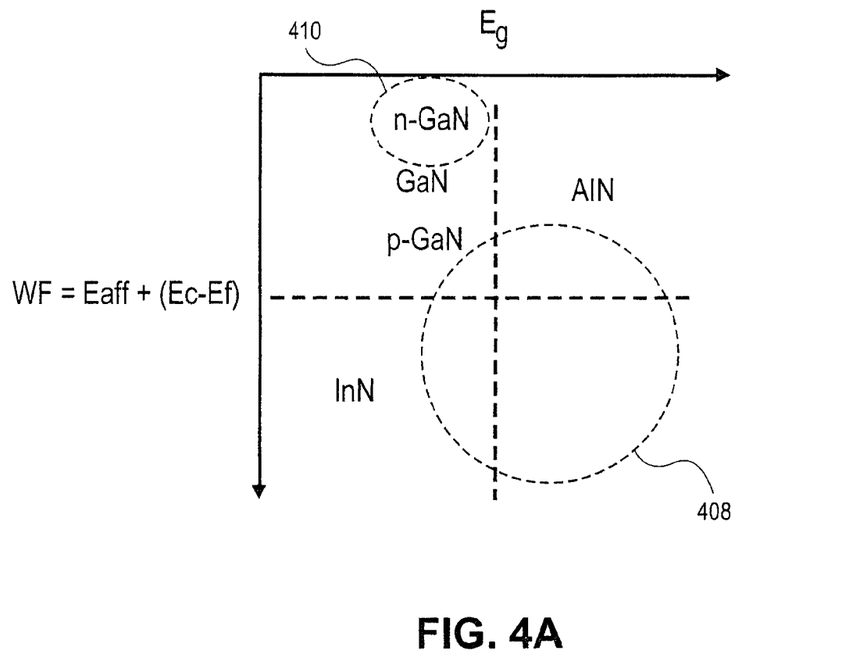
FIG. 4A is a graph depicting a band gap and electron affinity space for an etch stop layer, in accordance with embodiments.

FIG. 4A is a graph qualitatively depicting different zones within a band gap energy ($E_g$) and work function ($W_f$) space, where $W_F=E_{aff}+(E_c-E_f)$, with $E_c$=conduction band edge, and $E_f$=Fermi Level. As illustrated, the etch stop layer is most ideally within the high band gap, high work function zone 408 while the source/drain layers that are to be etchable (e.g., the source/drain transition layer) are limited to the low band gap, low work function zone 410. The relative sizes of zones 408 and 410 as well as their relative positions within the illustrate space is a function of the specific etch process conditions.

In a first embodiment, the etch stop layer 108 is an abruptly delta p-doped, or uniformly p-doped III-N semiconductor layer. In embodiments, the p-type dopant is Mg though any other p-type dopant known in the art may also be utilized (e.g., Be). In the exemplary embodiment, the etch stop layer 108 is p-doped GaN (p-GaN). In other embodiments, the etch stop layer 108 is a p-doped alloy of GaN with InN or AlN. Whether the etch stop layer 108 is GaN, or a GaN alloy with InN and/or AlN, the p-doping concentration may range from 1e15 to about 1e18 per $cm^{-3}$. For such embodiments, the etch stop layer 108 has a thickness of only 1-5 nm and preferably less than 4 nm, so that carriers may tunnel efficiently through the regions of the etch stop layer 108 disposed below the source 135 and drain 145 as the etch stop layer 108 is non-sacrificial at least in these regions of the transistor 100.

In a second embodiment, the etch stop layer 108 is an In-containing III-N semiconductor layer, such as $In_xAl_yN$ or $In_xGa_yN$. InN has one of the highest electron affinity of all semiconductor materials which may serve as the basis for a selective recess etch process, as described elsewhere herein. In further embodiments, the In-containing III-N etch stop layer 108 is p-doped to place the etch stop layer 108 even farther from the zone 410 (FIG. 4A). P-doping is particularly advantageous for $In_xGa_yN$ as the relatively smaller band gap will make it more susceptible to the photochemical etch processes described elsewhere herein, while P-doping will increase the $E_c-E_f$, hence the WF, increasing effectiveness as an etch stop. For the In-containing embodiments, the etch stop layer 108 again has a thickness of only 1-5 nm and preferably less than 4 nm for improving carrier tunneling through any band offsets induced by the etch stop layer 108 in the Source/Drain region.

In a third embodiment, the etch stop layer 108 is a wide bandgap III-N semiconductor (i.e., having a significantly wider bandgap than that of the source/drain layers (e.g., source/drain transition layer 110) that are to be etchable. Generally, the bandgap of the etch stop layer 108 is to exceed the quanta of energy of laser illumination employed in the photochemical etch process. In the exemplary embodiment where the source/drain transition layer is GaN, having a bandgap of approximately 3.4 eV, the etch stop layer 108 preferably has a bandgap of higher than 3.4 eV, an example being $Al_{0.8}In_{0.2}N$ with a bandgap of 5.5 eV, and AlN being about 6.2 eV. $Al_{0.8}In_{0.2}N$ has the advantage of being nearly lattice-matched to GaN. For the wideband gap embodiments, the etch stop layer 108 is to be less than 5 nm and most advantageously have a thickness of only 1-3 nm for carrier tunneling through any band offsets induced by the etch stop layer 108 at the Source/Drain regions (which may be expected to be more significant than for the In-containing etch stop layer embodiments).

In a fourth embodiment, the etch stop layer 108 comprises a single alloy of GaN, InN and AlN. In further embodiments the single alloy is advantageously p-doped as described above to further suppress a recess etch process, improving etch selectivity. Optimization of the alloy composition is left to one of ordinary skill as efficacy of a particular a etch stop layer composition is dependent on the specific recess etch process conditions. For the alloy embodiments also, the etch stop layer 108 again has a thickness of only 1-5 nm and preferably less than 4 nm.

In a fifth embodiment, the etch stop layer 108 is a multi-layered stack containing at least two of the material layers described above (i.e., embodiments 1-4 of the etch stop layer 108). For multi-layer embodiments, the etch stop layer 108 advantageously has a thickness of only 1-7 nm and preferably less than 5 nm.

As further illustrated in FIG. 1A, a III-N oxide layer 120 is disposed over a portion of the etch stop layer 108 below a gate electrode 120. If 120 is grown (thermally or through plasma oxidation) while layers 110 and 112 are unmasked, a III-N oxide layer 121 will also form along the sidewall of 110 and 112 (and also on the top surface of 112). The III-N oxide 121 on the sidewalls is advantageous for forming a self-aligned spacer separating the gate electrode from the Source Drain layers 112 by a controlled and symmetrical amount.

Generally, the III-N oxide layer 120 (and 121) is an oxide of the etch stop layer 108 and therefore the exact composition of the III-N oxide layer 120 is a function of the composition of the etch stop layer 108. For example, in one particularly advantageous embodiment where the etch stop layer 108 is p-GaN, the III-N oxide layer 120 comprises MgGaON. In another exemplary embodiment, where the etch stop layer is multi-layered (i.e., fifth embodiment described above), only the top layer of the multi-layered etch stop layer is oxidized (e.g., $Al_xMg_yGa_zON$/p-GaN/AlN). Being an oxide of the III-N layer that is oxidized, the III-N oxide 120 may be considered a "native" oxide, however the III-N oxide 120 is distinguished from that which forms spontaneously in ambient fabrication environments at standard temperature and pressure in that at least one of thickness or quality (e.g., interface trap density) of the III-N oxide 120 is greater than the spontaneously formed film.

In the exemplary embodiment, the etch stop layer 108 is not completely oxidized (i.e., the etch stop layer 108 remains between the III-N oxide 120 and the barrier layer 106). This ensures that the barrier layer 106 is not oxidized (potentially affecting $V_t$ through sheet charge variation) in some locations due to non-uniformities in the as-deposited epitaxial layer thicknesses, recess etch, and the etch stop oxidation process. In particular embodiments, the III-N oxide layer 120 has a thickness of 4-6 nm, which will consume between 1-2 nm of the etch stop layer 108.

Certain oxides of III-N (e.g., GaN) are very stable and able to form exceptionally high quality interfaces with GaN showing low interface trap state density (e.g., $D_{it}$ of ~1e10/cm2-eV). As such, the III-N oxide is a good gate oxide for the MOS-transistor 100. GaON however has a relatively low bandgap energy of about 4.4 eV. Magnesium oxide has an advantageously large bandgap of 7.3 eV, as well as a moderately high dielectric constant (k) of 9.8. As such, embodiments of the present invention where the etch stop layer is p-GaN, the oxidized layer (MgGaON) is expected to be an excellent oxide for the MOS-transistor 100. Similarly, aluminum oxide is advantageous, with a bandgap of ~9 eV and k-value of 9. Incorporation of nitrogen in oxides is also known to improve quality and reliability of the oxide so that $Al_xMg_yGa_zON$ is an excellent oxide for the MOS-transistor 100.

In the embodiment illustrated in FIG. 1A, a non-native (non-III-N) dielectric layer 130 is disposed on the III-N oxide layer 120 to form a composite gate dielectric stack. In the exemplary embodiments, the non-native dielectric layer 130 has a higher dielectric constant than that of the III-N oxide layer 120. In specific embodiments, the non-native dielectric layer 130 is a high-k dielectric, such as, but not limited to, $HfO_2$, $ZrO_2$, HfOSiO, TaSiO, AlSiO, HfON, ZrSiON, HfSiON. With the addition of the high-k gate dielectric, the high quality interfacial properties of the III-N oxide layer 120 are achieved, as well as ultra-low gate leakage.

Figure 1B:
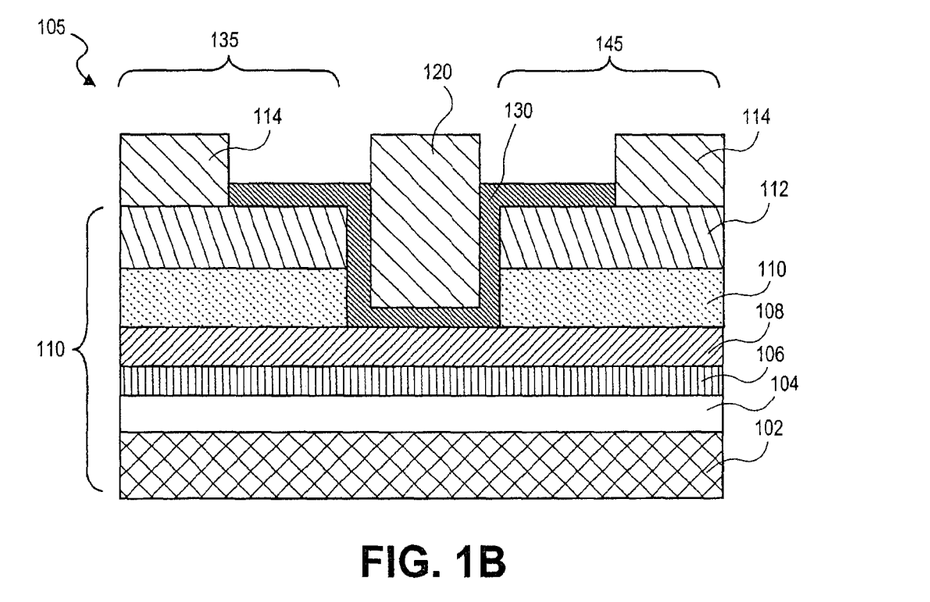
FIG. 1B illustrates a side view of a cross-section through a III-N MOS transistor with a III-N gate oxide, in accordance with an embodiment.

While the composite dielectric of FIG. 1A is illustrative of the plurality of functions of the etch stop layer 108 (e.g., as a seed layer for a particularly advantageous III-N oxide), it is to be appreciated that a MOS-HEMT transistor may also employ the III-N oxide alone without the addition of a high-k non-native dielectric. In still other embodiments (e.g., illustrated by the MOS-transistor 105 in FIG. 1B), the non-native dielectric layer 130 may be disposed directly on the etch stop layer 108 without an intervening 1-2 nm of III-N oxide.

Disposed over the gate dielectric (e.g., on the non-native dielectric layer 130) is the gate electrode 120 disposed in the recess between the source 135 and drain 145. Generally, any gate material known in the art for III-N devices may be employed. In one exemplary embodiment, the gate electrode 120 includes a work function metal disposed on the non-native dielectric layer 130 and a fill metal disposed over the workfunction metal, though the embodiments of the present invention are not limited by the gate electrode composition.

Figure 2:
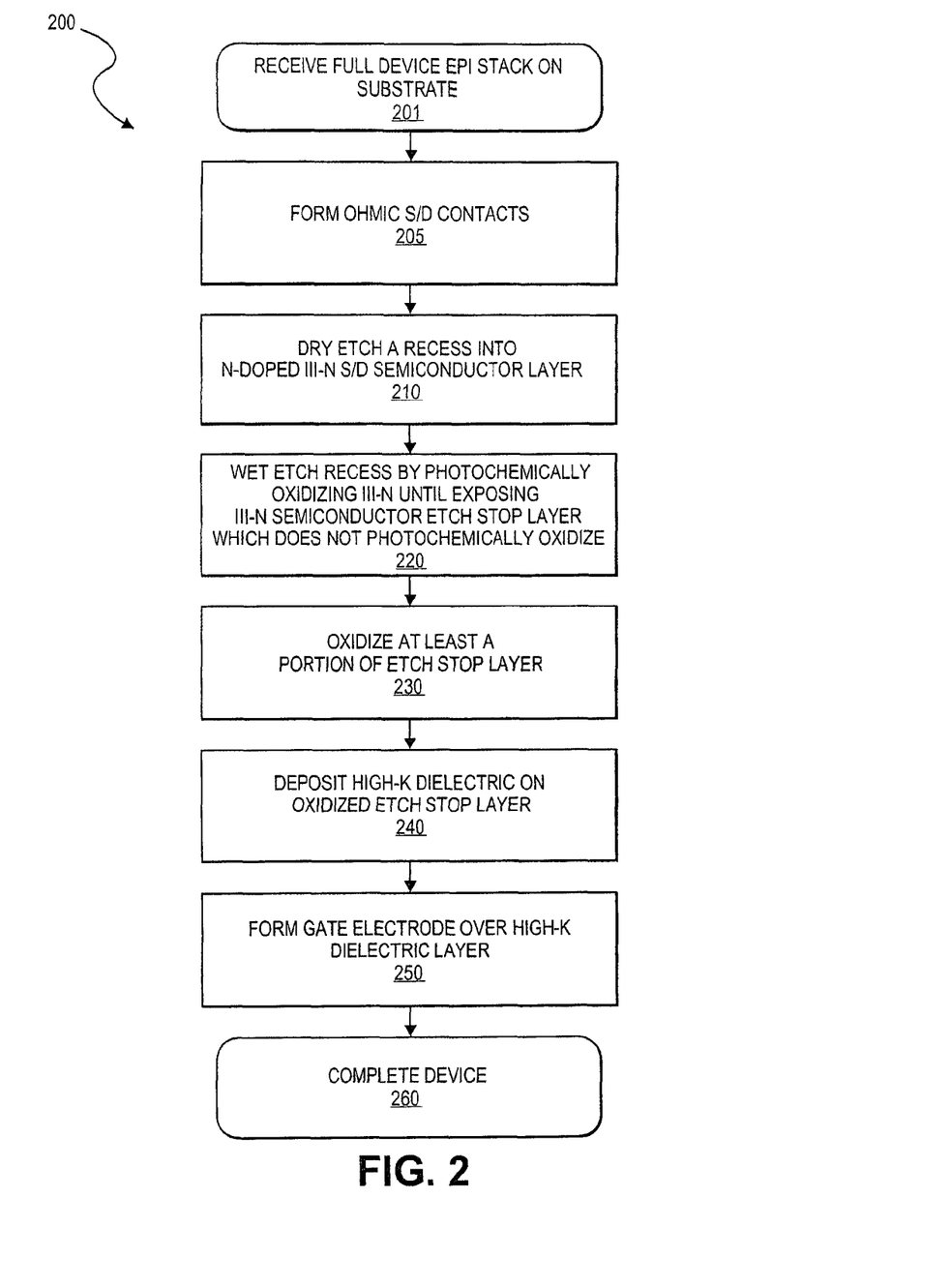
FIG. 2 is a flow diagram illustrating a method of fabricating the III-N MOS transistor of FIG. 1A, in accordance with an embodiment.

FIG. 2 is a flow diagram illustrating a method 200 for fabricating the III-N MOS transistor of FIG. 1A, in accordance with an embodiment. FIGS. 3A, 3B, 3C, 3D, 3E, and 3F illustrate side views of a cross-section through a III-N MOS transistor after certain operations in the method 200 are performed, in accordance with an embodiment.

Figure 3A:
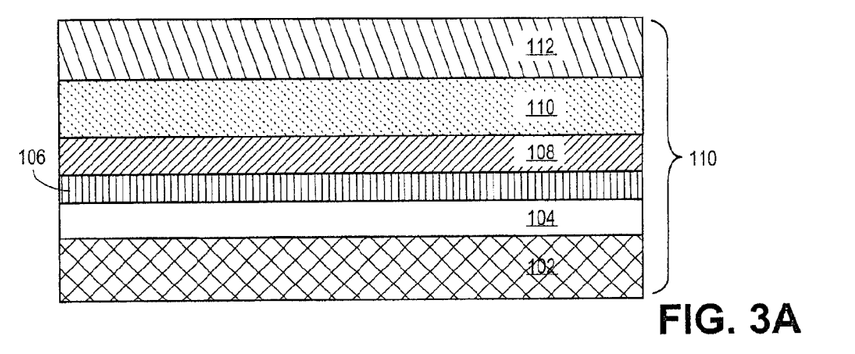
FIGS. 3A, 3B, 3C, 3D, 3E, and 3F illustrate side views of a cross-section through a III-N MOS transistor after certain operations in the method of FIG. 2 are performed, in accordance with an embodiment.

Referring to FIG. 2, method 200 begins at operation 201 with receiving a starting material that has the full epitaxial stack (e.g., epitaxial stack 110, as illustrated in FIG. 3A), with the layers 102, 104, 106, 108, 110 and 112 being substantially as described elsewhere herein. With the entire epitaxial stack 110, no source/drain regrowth is performed in the method 200.

Figure 3B:
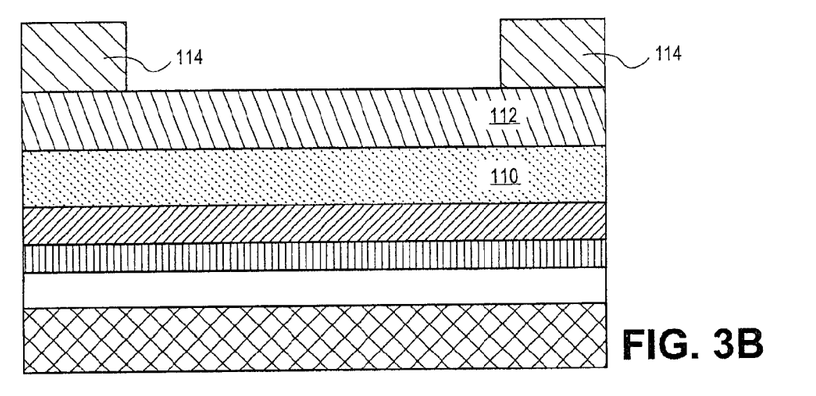

At operation 205, ohmic metal is deposited on the source/drain semiconductor layer 112 and patterned, for example to form the ohmic metal contacts 114 illustrated in FIG. 3B. Any conventional ohmic metal may be utilized as the present invention is not limited in this respect.

Continuing with FIG. 2, at operation 210 a recess is pattern using standard techniques (e.g., mask and expose) and then etched into the heavily n-doped III-N source/drain layer with a dry (plasma) etch process applicable to the particular composition of the III-N source/drain layer. For example, there are many known plasma etch processes for the exemplary n-GaN source/drain layer 112. In one particular embodiment, the dry etch is a timed process targeted to terminate with the etch front at the bottom of the recess approximately 50 nm above the upper surface of the etch stop layer 108. Ideally, the transition layer is somewhat thicker than 40-50 nm so that only some portion of the source/drain transition layer 110 remains over the etch stop layer 108 following the dry etch at operation 210.

Figure 3C:
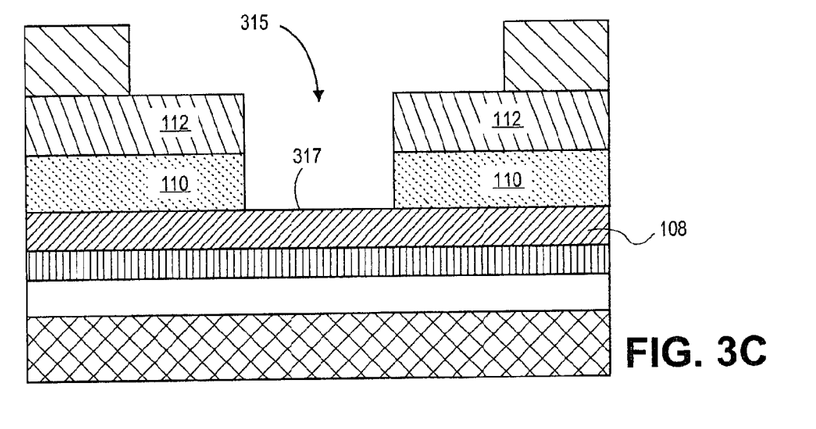

Following the dry etch, at operation 220, the recess etch front is advanced with a wet etch process that proceeds through the remainder of the source/drain layer by photochemically oxidizing the III-N material until exposing the etch stop layer which is more resistant to photochemical oxidation. Referring to FIG. 3C, the recess 315 is substantially complete with the etch front 317 exposing the etch stop layer 108. In the exemplary embodiment, the wet etch operation 200 entails exposing the etch front 317 to an electrolyte such as $H_3PO_4$, and simultaneously irradiating the III-N surface with a laser illumination of a wavelength and photon energy approximately equal to the bandgap of material to be etched (eg., GaN for the exemplary embodiment where the source/drain transition layer is GaN). Due to a work function difference between the electrolyte and the III-N semiconductor (GaN), a built-in electric field perpendicular to the surface of the III-N semiconductor will sweep all holes (h+) towards the surface and electrons towards the interior of the III-N semiconductor. These holes and electrons are generated by the absorption of the laser photons within the GaN semiconductor. Holes are required for the following chemical oxidation reaction converting GaN into $Ga_2O_3$ and $N_2$:

$$2GaN + 3H_2O + 6H^+ \rightarrow Ga_2O_3 + N_2 + 6H^+ \qquad (Eq.\ 1)$$

$Ga_2O_3$ is an oxide that readily dissolves in acids such as $H_3PO_4$ or HCl, so the etch front can proceed so long as the photochemical oxidation occurs.

Figure 4B:
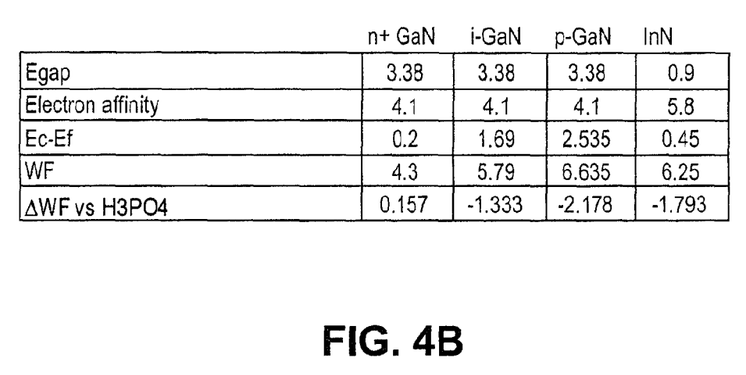
FIG. 4B is a table comparing parameters relevant to a photochemical oxidation, in accordance with an embodiment.

It is important that the built-in electric field perpendicular to the surface of the semiconductor points in the direction from the semiconductor to the electrolyte. This implies that the work function of the electrolyte must be larger than the work function of the III-N semiconductor. In the table illustrated in FIG. 4B, the work function (WF) of various semiconductors relevant to certain embodiments described herein are shown. Where the WF difference (ΔWF) is positive, the semiconductor is photochemically oxidized. The values shown in FIG. 4B were performed for the exemplary $H_3PO_4$ electrolyte and show that only n+ doped GaN can be photochemically oxidized and etched in $H_3PO_4$. Undoped i-GaN, p-GaN and InN will not etch under these conditions.

Notably, embodiments where the etch stop layer 108 has a much larger band gap energy than GaN (e.g., AlN, AlInN), the etch stop layer 108 will not oxidize because the laser photon energy must be at least as large as the band gap of the semiconductor in order to generate holes and electrons within the III-N semiconductor (holes being required for the oxidation process shown in Eq. 1). Therefore, the etch stop layer 108 will not etch at operation 220.

Figure 3D:
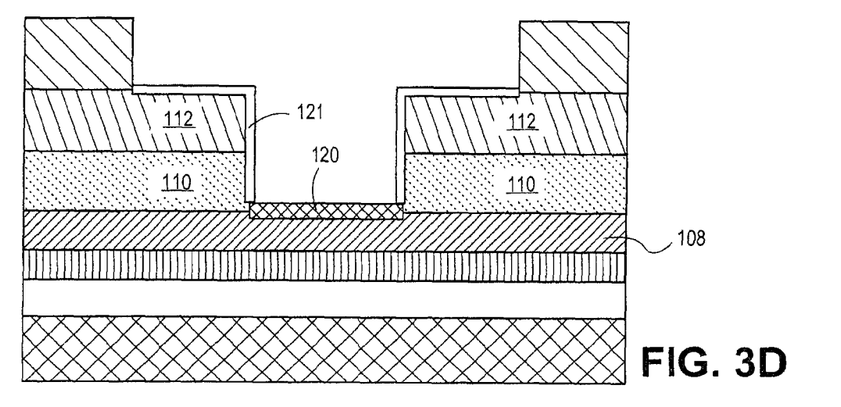

With the recess 315 formed, the method 200 proceeds to operation 230 where at least a portion of the etch stop layer 108 is oxidized to form the III-N oxide layer 120 illustrated in FIG. 3D. In the exemplary embodiment, a thermal oxidation is performed using any of a conventional furnace, rapid thermal anneal, or laser anneal. Thermal oxidation will form thicker and denser, higher quality III-N oxides than can ambient manufacturing conditions (i.e., standard temperature and pressure). In an alternative embodiment, a plasma oxidation of the etch stop layer is performed. Plasma oxides of GaN have also been found to be of high quality and density and form a good quality interface with GaN.

Figure 3E:
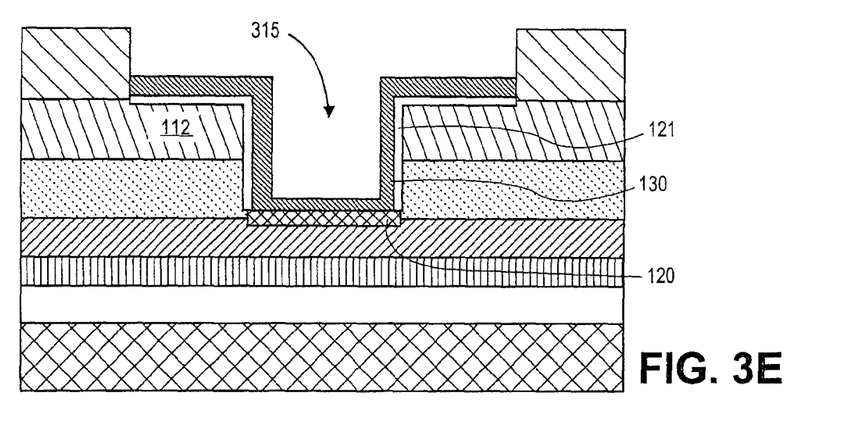
Figure 3F:
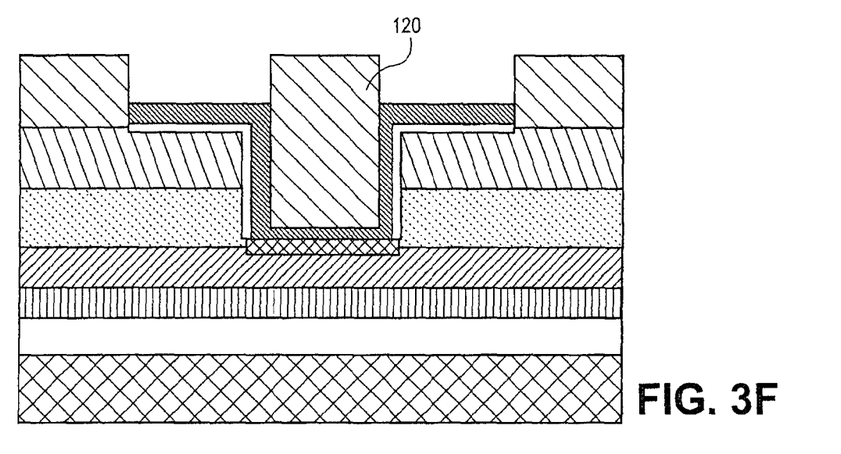

Returning to FIG. 2, at operation 240 a high-k dielectric layer is deposited using conventional techniques (e.g., atomic layer deposition, (ALD)) and at operation 250 the gate electrode is formed in the recess, as further shown in FIGS. 3E and 3F where the gate electrode 120 is formed in the recess 315. The method 200 then proceeds with completing the device operation 250 with performance of a conventional process flow.

Figure 5:
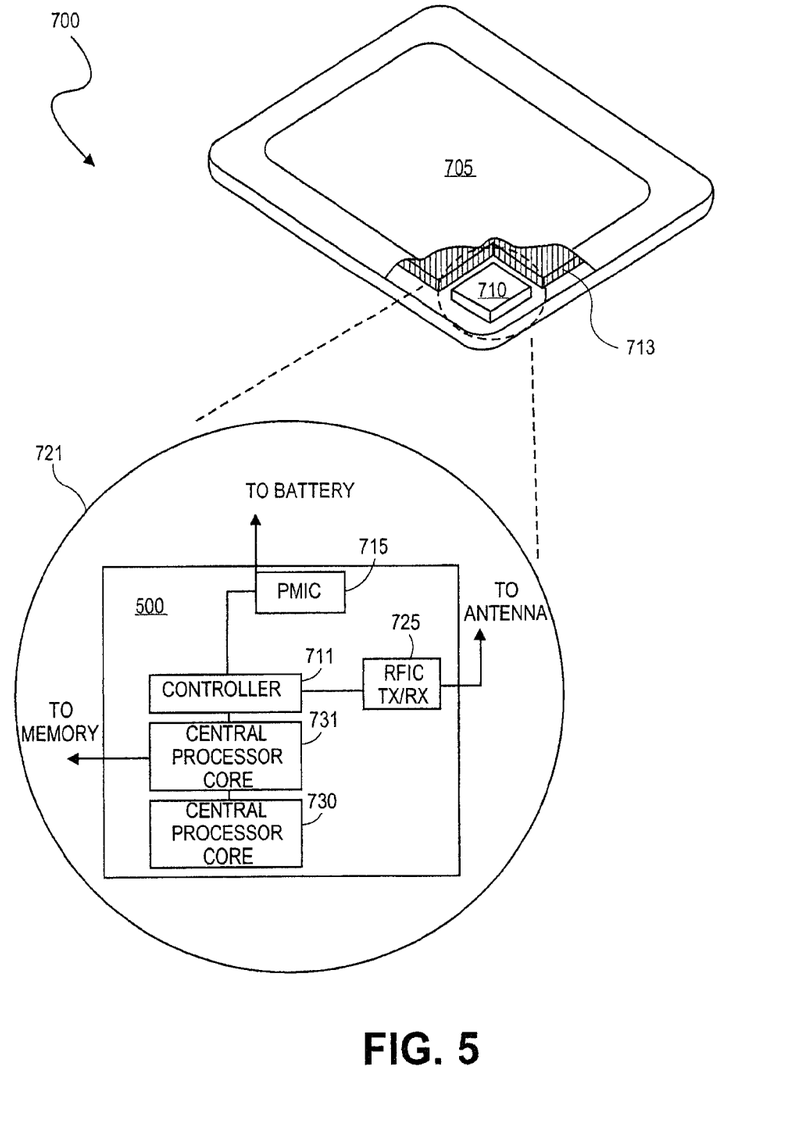
FIG. 5 is a functional block diagram of an SOC implementation of a mobile computing platform, in accordance with an embodiment of the present invention.

FIG. 5 is a functional block diagram of a SoC implementation of a mobile computing platform, in accordance with an embodiment of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705 that is in the exemplary embodiment a touch-screen (e.g., capacitive, inductive, resistive, etc.) permitting the receipt of user input, the SoC 710, and a battery 713. As illustrated, the greater the level of integration of the SoC 710, the more of the form factor within the mobile computing platform 700 that may be occupied by the battery 713 for longest operative lifetimes between charging, or occupied by memory (not depicted), such as a solid state drive for greatest functionality.

The SoC 710 is further illustrated in the expanded view 720. Depending on the embodiment, the SoC 710 includes a portion of a substrate 500 (i.e., a chip) upon which two or more of a power management integrated circuit (PMIC) 715, RF integrated circuit (RFIC) 725 including an RF transmitter and/or receiver, a controller thereof 711, and one or more central processor core 730, 731 is fabricated. The RFIC 725 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The platform 725 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively except in the PMIC 715 and RFIC 725, which typically utilize LDMOS and III-V HBT technologies, respectively. In embodiments of the present invention however, the PMIC 715 and RFIC 725 employ the III-N transistors described herein (e.g., III-N transistor 100 or 105). In further embodiments the PMIC 715 and RFIC 725 employing the III-N transistors described herein are integrated with one or more of the controller 711 and processor cores 730, 731 provided in silicon CMOS technology monolithically integrated with the PMIC 715 and/or RFIC 725 onto the (silicon) substrate 500. It will be appreciated that within the PMIC 715 and/or RFIC 725, the high voltage, high frequency capable III-N transistors described herein need not be utilized in exclusion to CMOS, but rather silicon CMOS may be further included in each of the PMIC 715 and RFIC 725.

The III-N transistors described herein may be specifically utilized where a high voltage swings present (e.g., 7-10V battery power regulation, DC-to-DC conversion, etc. within the PMIC 715). As illustrated, in the exemplary embodiment the PMIC 715 has an input coupled to the battery 713 and has an output provide a current supply to all the other functional modules in the SoC 710. In a further embodiment, where additional ICs are provided within the mobile computing platform 700 but off the SoC 710, the PMIC 715 output further provides a current supply to all these additional ICs off the SoC 710. With the reduced ON resistance available (e.g., through the symmetric $L_{gd}/L_{gs}$) and low access resistance (e.g., 2DEG 111 present in spacer region within channel layer 107), particular embodiments of the III-N transistors described herein permit the PMIC to operate at higher frequencies (e.g., 50× those possible in LDMOS implementations). In certain such embodiments, inductive elements within the PMIC (e.g., buck-boost convertors, etc.) may be scaled to much smaller dimensions. As such inductive elements in the PMIC account for 60-70% of chip area, embodiments of the PMIC implemented in the III-N transistors described herein offer a significant shrink over other PMIC architectures.

As further illustrated, in the exemplary embodiment the RFIC 715 has an output coupled to an antenna and may further have an input coupled to a communication modules on the SoC 710, such as an RF analog and digital baseband module (not depicted). Alternatively, such communication modules may be provided on an IC off-chip from the SoC 710 and coupled into the SoC 710 for transmission. Depending on the III-N materials utilized, the III-N transistors described herein (e.g., 200 or 201) may further provide the large power added efficiency (PAE) needed from a power amplifier transistor having an $F_t$ of at least ten times carrier frequency (e.g., a 1.9 GHz in an RFIC 725 designed for 3G or GSM cellular communication).

Figure 6:
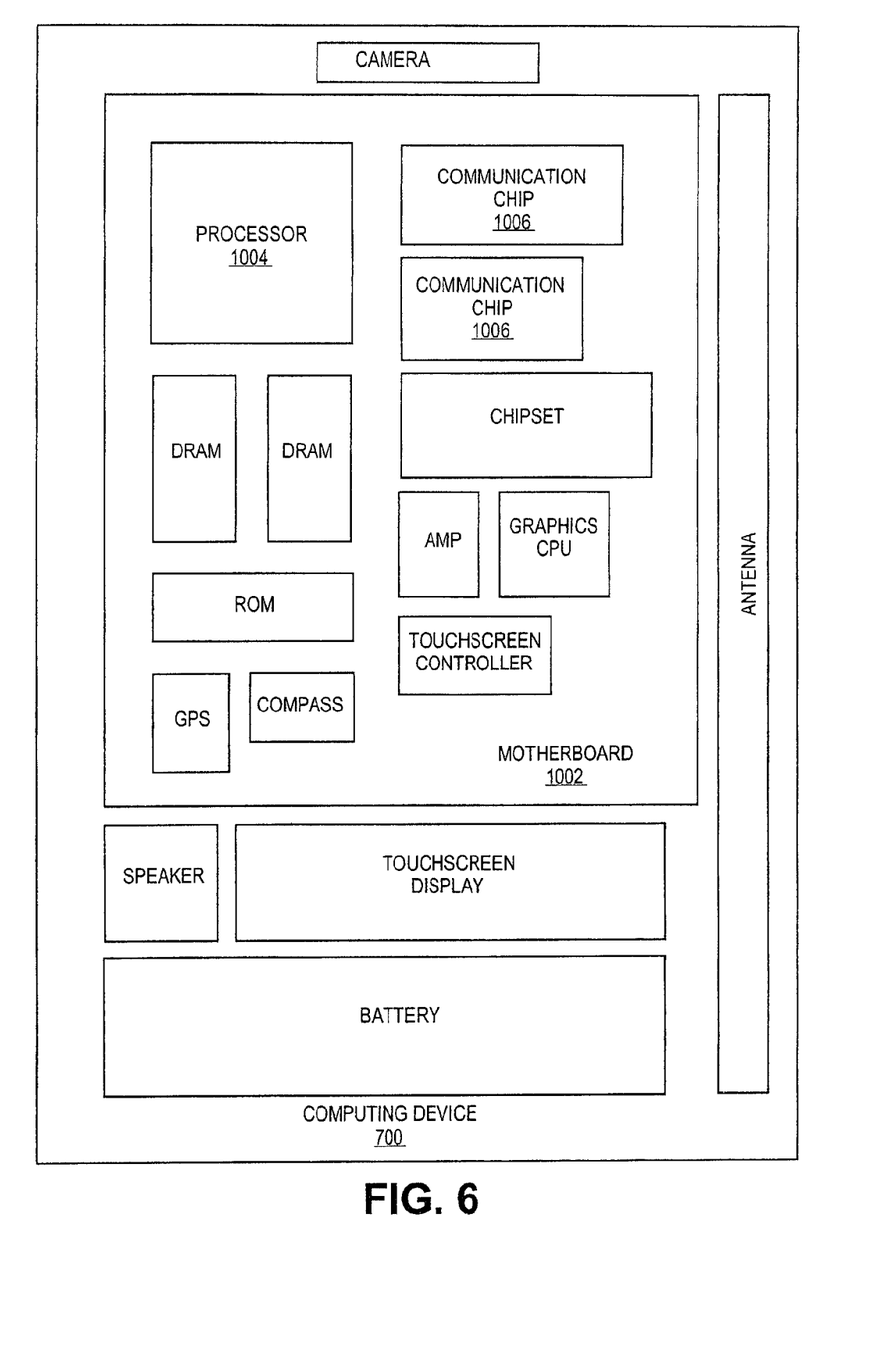
FIG. 6 is a function block diagram further illustrating components of the mobile computing platform of FIG. 5, in accordance with an embodiment.

FIG. 6 further illustrates functional block of the computing platform 700 in accordance with one implementation of the invention. The computing device 700 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as gate recessed III-N MOS transistors like the transistor 100. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as gate recessed III-N MOS transistors like the transistor 100.

In further implementations, another component housed within the computing device 1000 may contain an integrated circuit die that includes one or more devices, such as gate recessed III-N MOS transistors like the transistor 100.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

The above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A III-N transistor comprising:
a III-N semiconductor channel layer disposed over a substrate;
a III-N semiconductor barrier layer disposed over the channel layer, the barrier layer having a larger band gap than that of the channel layer;
a III-N semiconductor material layer disposed over the barrier layer;
an oxide layer of the III-N semiconductor material layer disposed on a first portion of the III-N semiconductor material layer;
a gate electrode disposed above the oxide layer of the III-N semiconductor material layer;
III-N semiconductor source and drain regions disposed at opposite sides of the gate electrode, the III-N semiconductor source and drain regions disposed directly on second portions of the III-N semiconductor material layer; and
an oxide layer of the III-N semiconductor source and drain regions at opposite sides of the gate electrode, the oxide layer of the III-N semiconductor source and drain regions laterally separating the gate electrode and the III-N semiconductor source and drain regions.

2. The III-N transistor of claim 1, wherein the III-N semiconductor material layer comprises an atomic species that is absent from the barrier layer.

3. The III-N transistor of claim 2, wherein the atomic species is at least one of a p-type dopant, In, or Al.

4. The III-N transistor of claim 3, wherein the III-N semiconductor material layer is uniformly or delta p-doped to between $1e^{15}$ to $1e^{18}$ cm$^{-3}$ and comprises Ga.

5. The III-N transistor of claim 4, wherein the III-N semiconductor material layer consists essentially of p-GaN, wherein the barrier layer comprises Al, and wherein the channel layer comprises GaN.

6. The III-N transistor of claim 3, wherein the III-N semiconductor material layer comprises In and further comprises at least one selected from the group consisting of a p-dopant, and Al.

7. The III-N transistor of claim 3, wherein the III-N semiconductor material layer is p-doped, comprises Ga, comprises In, and comprises Al.

8. The III-N transistor of claim 7, wherein the III-N semiconductor material layer comprises a single alloy layer of GaN, InN and AlN.

9. The III-N transistor of claim 1, further comprising:
a high-k gate dielectric layer disposed on the oxide layer of the III-N semiconductor material layer, wherein the gate electrode is disposed on the high-k gate dielectric layer.

10. The III-N transistor of claim 1, wherein the oxide layer of the III-N semiconductor source and drain regions is disposed along upper surfaces of the III-N semiconductor source and drain regions.

11. A method of forming a III-N transistor, the method comprising:
etching a trench in a III-N semiconductor material layer formed directly on a III-N semiconductor barrier layer different from the III-N semiconductor material layer, wherein the etching terminates on and exposes a first portion of the III-N semiconductor barrier layer at the bottom of the trench, and wherein the III-N semiconductor barrier layer is formed over a III-N semiconductor channel layer formed over a substrate;
oxidizing at least a partial thickness of the exposed first portion of the III-N semiconductor barrier layer and at least sidewalls of the III-N semiconductor material layer exposed in the trench to form an oxide layer of the III-N semiconductor barrier layer at the bottom of the trench and to form an oxide layer of the III-N semiconductor material layer along sidewalls of the trench;
forming a gate electrode above the oxide layer of the III-N semiconductor barrier layer and laterally between the oxide layer of the III-N semiconductor material layer along sidewalls of the trench; and
forming III-N semiconductor source and drain regions in the III-N semiconductor material layer, on opposite sides of the gate electrode.

12. The method of claim 11, wherein oxidizing the exposed first portion of the III-N semiconductor barrier layer and sidewalls of the III-N semiconductor material layer exposed in the trench comprises using a plasma oxidation process or a thermal oxidation process.

13. The method of claim 11, wherein etching the trench comprises photochemically oxidizing the III-N semiconductor material layer along an etch front of the trench to form a III-N oxide; and
wet chemical etching III-N oxide.

14. The method of claim 13, wherein photochemically oxidizing the III-N semiconductor material layer further comprises irradiating the etch front with laser energy of a quanta that is absorbed by the III-N semiconductor material layer while the etch front is immersed in an electrolyte having a work function greater than the work function of the III-N semiconductor material layer.

15. The method of claim 14, wherein the III-N semiconductor barrier layer has a band gap exceeding the quanta of laser energy or has a work function greater than that of the electrolyte.

16. The method of claim 14, wherein the wet etchant is the electrolyte and comprises $H_3PO_4$, wherein the III-N semiconductor material layer is n-type GaN and wherein the second III-N semiconductor material layer comprises at least one of a p-type dopant, In, or Al.

17. The method of claim 11, further comprising:
prior to forming the gate electrode, forming a high-k gate dielectric layer on the oxide layer of the III-N semiconductor barrier layer, wherein the gate electrode is formed on the high-k gate dielectric layer.

18. The method of claim 11, wherein etching the trench in the III-N semiconductor material layer further comprises etching the trench in a second III-N semiconductor material layer formed directly on the III-N semiconductor material layer.

19. The method of claim 18, wherein the oxidizing further oxidizes at least the sidewalls of the second III-N semiconductor material layer exposed in the trench to form an oxide layer of the second III-N semiconductor material layer.

20. The method of claim 19, wherein the oxidizing further oxidizes upper surfaces of the second III-N semiconductor material to form the oxide layer of the second III-N semiconductor material layer on the upper surfaces of the second III-N semiconductor material layer.

* * * * *